(12) United States Patent
Yamamoto et al.

(10) Patent No.: US 7,705,408 B2
(45) Date of Patent: Apr. 27, 2010

(54) VERTICAL FIELD EFFECT TRANSISTOR

(75) Inventors: Hideo Yamamoto, Kanagawa (JP);
Kenya Kobayashi, Kanagawa (JP)

(73) Assignee: NEC Electronics Corporation,
Nakahara-ku, Kawasaki (JP)

( * ) Notice: Subject to any disclaimer, the term of this patent is extended or adjusted under 35 U.S.C. 154(b) by 72 days.

(21) Appl. No.: 11/191,929

(22) Filed: Jul. 29, 2005

(65) Prior Publication Data
US 2006/0226475 A1    Oct. 12, 2006

(30) Foreign Application Priority Data
Apr. 11, 2005  (JP)  ............... 2005-113289

(51) Int. Cl.
*H01L 27/088* (2006.01)
(52) U.S. Cl. ............... 257/401; 257/E21.624
(58) Field of Classification Search ......... 257/329–331, 257/401, E21.624
See application file for complete search history.

(56) References Cited
U.S. PATENT DOCUMENTS 5,191,396 A * 3/1993 Lidow et al. ............... 257/339
5,847,413 A * 12/1998 Yamazaki et al. ............. 257/69
6,445,036 B1 * 9/2002 Maruoka .................... 257/330
6,822,288 B2 * 11/2004 Hshieh et al. ............... 257/330
2006/0180855 A1 * 8/2006 Bhalla et al. ................ 257/330

FOREIGN PATENT DOCUMENTS

| JP | 07066392 A | * 3/1995 |
| JP | 2903452 | 3/1999 |
| JP | 3099917 | 8/2000 |
| JP | 2003-318396 | 11/2003 |

* cited by examiner

*Primary Examiner*—Bradley K Smith
*Assistant Examiner*—Amar Movva
(74) *Attorney, Agent, or Firm*—McGinn IP Law Group, PLLC

(57) ABSTRACT

A MOSFET has a base layer and a source layer in a cell surrounded by a trench gate formed in a semiconductor substrate. A trench contact is formed through the source layer and the base layer. The gate is polygonal such as square. The trench contact is thin and linear so as to increase embedding characteristics. Further, the trench contact is ring or cross shaped so as to reduce a source length.

19 Claims, 11 Drawing Sheets

RELATED ART

VERTICAL FIELD EFFECT TRANSISTOR

BACKGROUND OF THE INVENTION

1. Field of the Invention

The present invention relates to vertical field effect transistors and, particularly, to the contact structure of a vertical metal oxide semiconductor field effect transistor (MOSFET).

2. Description of Related Art

Vertical MOSFETs have been used for various purposes. FIG. 10 shows the structure of a conventional MOSFET disclosed in Japanese Unexamined Patent Publication No. 2003-318396, for example, which illustrates a plan view of the layer including an $N^+$ source layer 209. FIG. 11A is a sectional view along line XIA-XIA of FIG. 10A, and FIG. 11B is a sectional view along line XIB-XIB of FIG. 10B. In this MOSFET, a $P^-$ base layer 203 and the $N^+$ source layer 209 are successively formed on an $N^-$ epitaxial layer 202, which is formed on the surface of an $N^+$ silicon substrate 201. Further, a trench 205 is formed to penetrate through the $P^-$ base layer 203 and reach the $N^-$ epitaxial layer 202, and a gate oxide film 206 and a polysilicon 207 are embedded in the trench 205.

An interlayer oxide film 208 is formed on the polysilicon 207 which serves as a gate electrode. A contact hole 210 with a given depth that penetrates through the $N^+$ source layer 209 to reach the $P^-$ base layer 203 is made between adjacent trench gates. A $P^+$ base contact layer 204 is formed immediately beneath the contact hole 210. A trench contact 211 is deposited in the contact hole 210, and a source electrode 212 is formed on its surface. A drain electrode 213 is formed on the rear surface of the $N^+$ silicon substrate 201.

An application of a vertical MOSFET is recently found in a DC/DC converter of a small personal computer (PC), which requires high speed processing. It is important in a vertical MOSFET used in such an application to reduce parasitic capacitance. Thus, some techniques increase a cell size in order to reduce a total area of a gate oxide film.

In a MOSFET with a relatively large cell, reducing a source length L requires increasing the size of the trench contact 211. If the large trench contact 211 is formed by filling aluminum (Al), for example, one side of the aperture size needs to be 1.5 μm or more.

Since the contact hole 210 is relatively large in the conventional MOSFET with a relatively large cell, it is easy to fill the contact hole 210 uniformly with Al without any space. However, if the cell size is 3 to 4 μm or smaller, the contact hole 210 is also small. Thus, the contact hole 210 cannot be filled with Al, and a void 214 appears in the upper central part of the contact hole 210, causing contact resistance to increase.

In order to prevent this problem from occurring, tungsten (W) is used as the trench contact 211 to be filled into the relatively small contact hole 210. However, in the case of using W as the material of the trench contact 211, even if the contact hole 210 is relatively small, if the aperture diameter of the trench contact 211 is larger than 1.2 μm, for example, it is difficult to fill the contact hole 210 completely with W in one process, and a depressed part is created in the upper surface. If the source electrode 212 is formed with Al when the depressed part exists, the source electrode 212 has a void 214 or becomes uneven as shown in FIG. 11B, which causes contact resistance to increase.

On the other hand, if the sizes of the contact hole 210 and the trench contact 211 are reduced with respect to the cell size as shown in FIGS. 12A and 12B, the source length L increases, which raises the need for designing a drain-source withstand voltage and a threshold voltage for each cell size, which decreases design efficiency. Further, if the source length L increases, the parasitic resistance of the $N^+$ source layer 209 and the $P^-$ base layer 203 increases accordingly. If the voltage generated in the parasitic resistor of the $P^-$ base layer 203 increases when an applied voltage exceeds the drain-source withstand voltage and avalanche current flows, a parasitic bipolar transistor composed of the $N^-$ epitaxial layer 202, the $P^-$ base layer 203, and the $N^+$ source layer 209 operates. Thus, the voltage generated in the parasitic resistor corresponds to a base-emitter voltage of the parasitic bipolar transistor. If the parasitic bipolar transistor operates, the avalanche current increases and the MOSFET is subject to breakdown.

Further, if the size of the trench contact 211 is reduced with respect to the cell size, it is difficult to contact the trench contact 211 and the $N^+$ source layer 209 if the $N^+$ source layer 209 is divided by an area 216 where the $N^+$ source layer 209 is not formed for higher avalanche resistance (for example, Japanese Patent No. 2903452 and No. 3099917) as shown in FIG. 13.

SUMMARY OF THE INVENTION

According to one aspect of the invention, there is provided a field effect transistor which includes a base layer and a source layer formed in a cell surrounded by a trench gate in a semiconductor substrate, a trench contact formed in the cell so as to extend from a first surface of the semiconductor substrate to the source layer and the base layer, a source electrode formed to the first surface and connected to the trench contact, and a drain electrode formed to a second surface opposite from the first surface, wherein the gate has a polygonal shape when viewed from the first surface, and the trench contact is linear when viewed from the first surface and at least partly placed in near proximity to the gate with a substantially equal distance apart from each side of the gate. In this field effect transistor, the trench contact has a width of 1.4 μm or less, and at least part of the trench contact is placed in a position 0.6 μm or less apart from the gate.

In this structure, the trench contact is linear to allow high embedding characteristics, and it is placed in the vicinity of the gate to shorten the source length, thereby avoiding breakdown due to an increase in avalanche current. Further, since the trench contact is placed substantially the same distance from each side of the gate, the source length is uniform, thereby effectively avoiding breakdown due to an increase in avalanche current.

The present invention provides a field effect transistor having a trench contact structure with high embedding characteristics and avoiding the problems occurring due to a long source length. The present invention also provides a field effect transistor providing good contact with the source layer even in a noncyclic source layout.

BRIEF DESCRIPTION OF THE DRAWING

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1A:
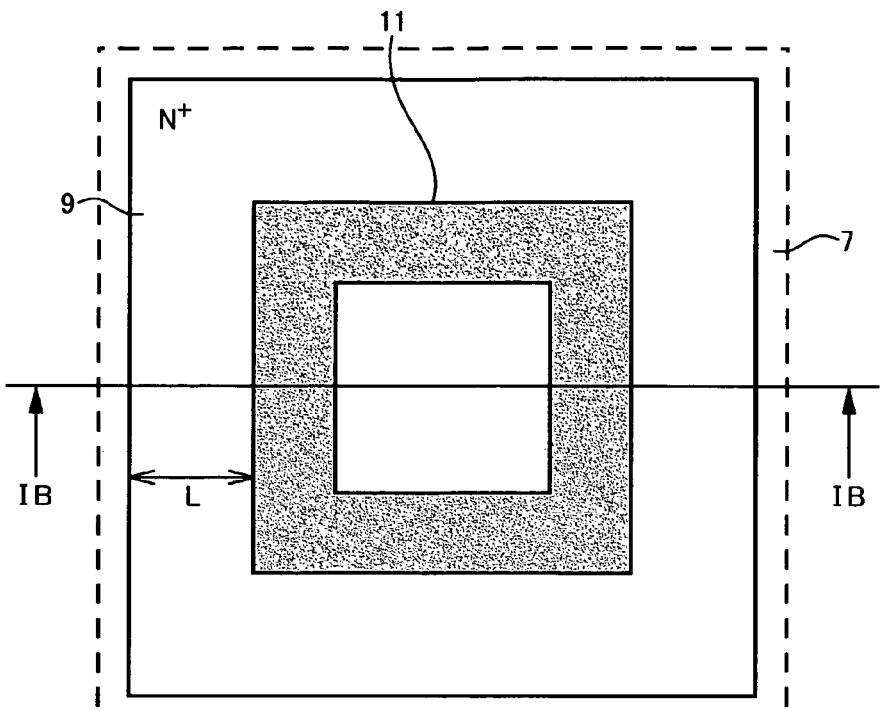
FIG. 1A is a plan view showing the structure of a MOSFET according to a first embodiment of the invention.
Figure 1B:
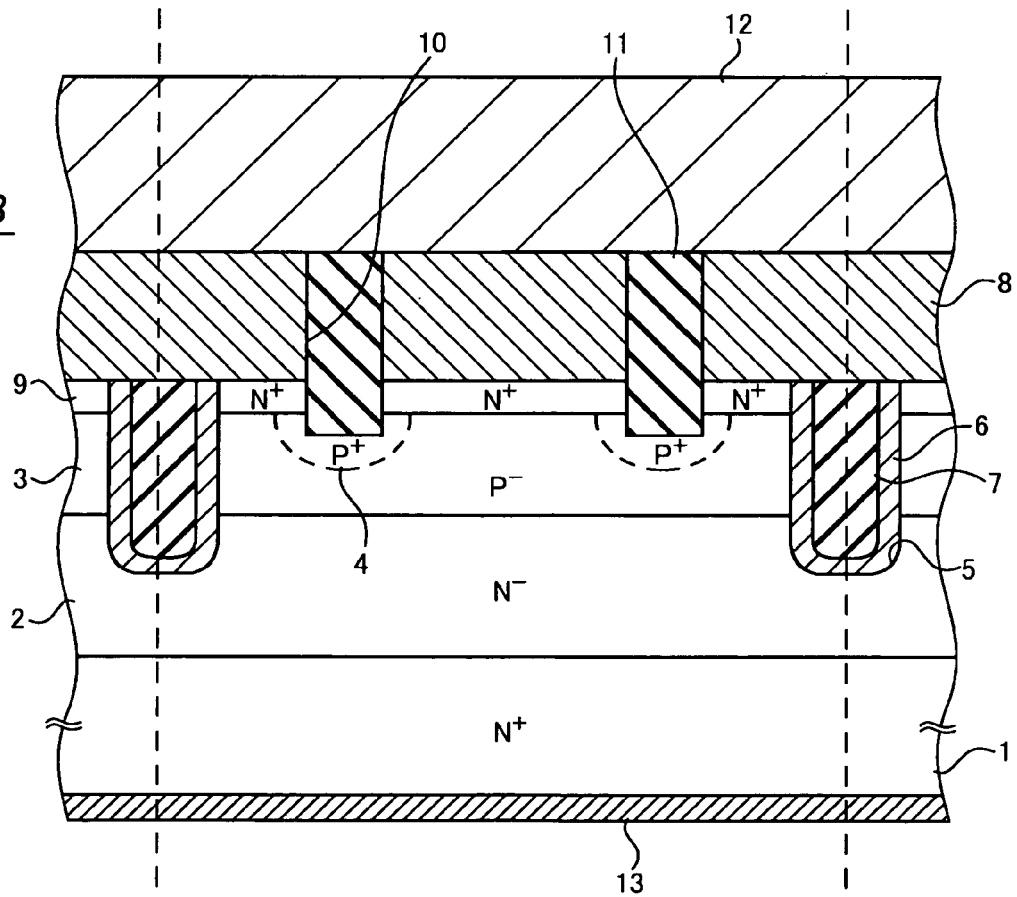
FIG. 1B is a cross sectional view of the same.

FIG. 1 shows the structure of a MOSFET according to a first embodiment of the invention. FIG. 1A is a plan view illustrating a layer having an $N^+$ source layer 9. FIG. 1B is a cross-sectional view along line IB-IB of FIG. 1A.

In this MOSFET, a $P^-$ base layer 3 and the $N^+$ source layer 9 are successively formed on an $N^-$ epitaxial layer 2, which is formed on the surface of an $N^+$ silicon substrate 1. A trench 5 is formed to penetrate through the $P^-$ base layer 3 and reach the $N^-$ epitaxial layer 2, and a gate oxide film 6 and a polysilicon 7 are embedded in the trench 5. The polysilicon 7 is formed in a rectangular shape, which is one mode of a polygonal shape, when viewed from the top.

An interlayer oxide film 8 is formed on the polysilicon 7 which serves as a gate electrode. A contact hole 10 with a given depth that penetrates through the N+source layer 9 to reach the $P^-$ base layer 3 is made between adjacent trench gates. A $P^+$ base contact layer 4 is formed immediately beneath the contact hole 10. A trench contact 11 is deposited in the contact hole 10, and a source electrode 12 is formed on its surface. A drain electrode 13 is formed on the rear surface of the $N^+$ silicon substrate 1.

In this MOSFET, if a voltage higher than a threshold voltage Vt is applied to a gate electrode (not shown) which is connected to the polysilicon 7, the $P^-$ base 3 in contact with the side wall of the trench 5 is inverted to become a channel where drain current flows. Specifically, a current path in the ON-state involves the source electrode 12, the trench contact 11, the $N^+$ source layer 9, the channel area, the $N^-$ epitaxial layer 2, the $N^+$ silicon substrate 1, and the drain electrode 13. In the OFF-state when no voltage is applied to the gate electrode, it is possible to apply a high voltage between the drain electrode 13 and the source electrode 12. A depletion layer is created mainly in the PN junction of the $N^-$ epitaxial layer 2 and the $P^-$ base layer 3. If an applied voltage exceeds a withstand voltage, breakdown occurs and avalanche current flows between the drain and the source.

The cell of the MOSFET of this embodiment, which is a unit cell, is a square which is surrounded by a dotted line in FIG. 1A, whose one side is from the center of one trench 5 (the center of the gate electrode 7) to the center of another trench 5 (the center of the gate electrode 7) shown in FIG. 1B. The contact hole 10 and the trench contact 11 of the MOSFET are linear structures and ring or circular shaped when viewed from the top as shown in FIG. 1A. The trench contact 11 is point symmetric about the center of the cell. Though the trench contact 11 is placed in the central area of the cell in the conventional technique, it is not placed in the central area of the cell but placed in the area surrounding the central area in this embodiment. The trench contact 11 has a square shape with four sides respectively parallel to the sides of the square gate electrode 7. Thus, the circumference of the trench contact 11 and the gate electrode 7 are similar. The distance between the trench contact 11 and the gate electrode 7 is a source length L. In this embodiment, the circumference of the trench contact 11 is placed within a given distance range from the gate electrode 7 in the outer periphery of the cell. The source length L is thus short, and the parasitic bipolar transistor is unlikely to operate. It is thereby possible to prevent that avalanche current increases due to the operation of the parasitic bipolar transistor to cause breakdown of the MOSFET. Particularly, the distance between the gate electrode 7 and the trench contact 11 is uniform and the source length is the same in this embodiment, the effect of preventing breakdown is high.

The cell of the MOSFET of the first embodiment is square-shaped as shown in FIG. 1A, and the cell size which is defined by its one side is 3 to 4 μm, for example. The width of the trench contact 11 is 0.3 to 1.2 μm and more preferably 0.4 to 0.8 μm in consideration of embedding characteristics. The source length L is 0.3 to 0.6 μm, for example.

By making the trench contact 11 ring-shaped, it is possible to reduce the width without increasing the source length L, thereby improving the embedding characteristics.

The process of manufacturing the MOSFET according to the embodiment is briefly described below. First, the process grows the $N^-$ epitaxial layer 2 on the surface of the $N^+$ silicon substrate 1. Then, after forming an oxide film ($SiO_2$) with the thickness of 10 to 50 nm by thermal oxidation, it deposits a nitride film ($Si_3N_4$) with the thickness of 100 to 200 nm and an oxide film with the thickness of 100 to 200 nm by chemical vapor deposition (CVD), and patterns the composite film by photolithography. After that, the process performs silicon etching using the composite film as a mask, thereby forming the trench 5 on the $N^-$ epitaxial layer 2. Then, after removing the composite film by etching, the aperture corner and the bottom corner of the trench 5 are rounded. The process further forms the gate oxide film 6 with the thickness of 10 to 100 nm on the surface of the $N^-$ epitaxial layer 2 and in the trench 5 by thermal oxidation, and deposits the polysilicon 7 by CVD.

Then, the process etches back the polysilicon 7 so as to remain only inside the trench 5. It then performs implantation of boron (B) or boron fluoride (BF$_2$) ion and thermal treatment in the oxygen or nitrogen atmosphere, thereby forming the P$^-$ base layer 3 which is shallower than the trench 5. Further, it performs implantation of As ion and thermal treatment in the nitrogen atmosphere on the surface of the P$^-$ base layer 3, thereby forming the N$^+$ source layer 9. Then, it deposits the interlayer oxide layer 8 with the thickness of 0.5 to 1 μm by CVD. After that, the process performs patterning by photolithography, etches the interlayer oxide layer 8, and successively etches silicon to the depth that penetrates the N$^+$ source layer 9 to reach the P$^-$ base layer 3, thereby creating the contact hole 10.

After depositing the oxide film with the thickness of 5 to 30 nm by CVD, the process performs implantation of BF$_2$ ion and thermal treatment in the nitrogen atmosphere for activation, thereby forming the P$^+$ base contact layer 4 below the bottom of the contact hole 10. The process then removes the oxide film, deposits a barrier metal composed of titanium (Ti) and titanium nitride (TiN) by sputtering, and further deposits W by CVD. The thickness of W is equal to or more than the aperture width of the contact hole 10. It then etches back W so that it remains inside the contact hole 10 in plug shape. The trench contact 11 is formed by W. After that, the process deposits aluminum (Al), aluminum silicon (AlSi), or aluminum copper silicon (AlSiCu) by sputtering to form the source electrode 12. Then, it deposits glazing material such as an oxide film and a nitride film as a surface overcoat and performs patterning by photolithography and etching to form a bonding area or the like. Finally, the process grinds the rear surface of the N$^+$ silicon substrate 1 by a given thickness and evaporates several kinds of metal, thereby forming the drain electrode 13.

Figure 6:
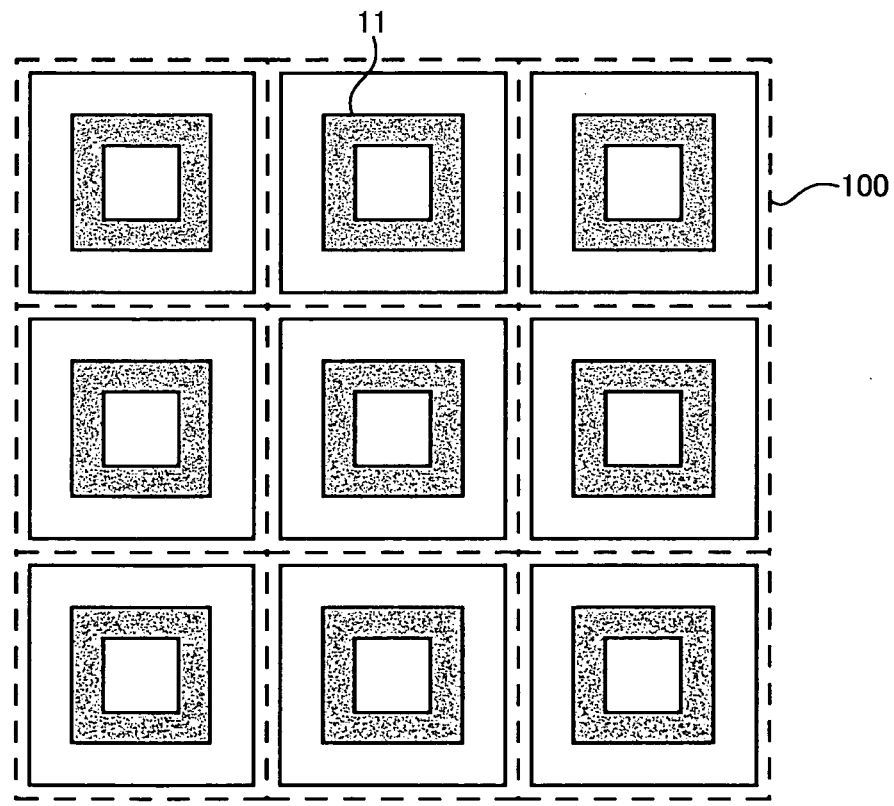
FIG. 6 is a pattern diagram of the layout where the cells of the first embodiment of the invention are arranged in a square pattern
Figure 7:
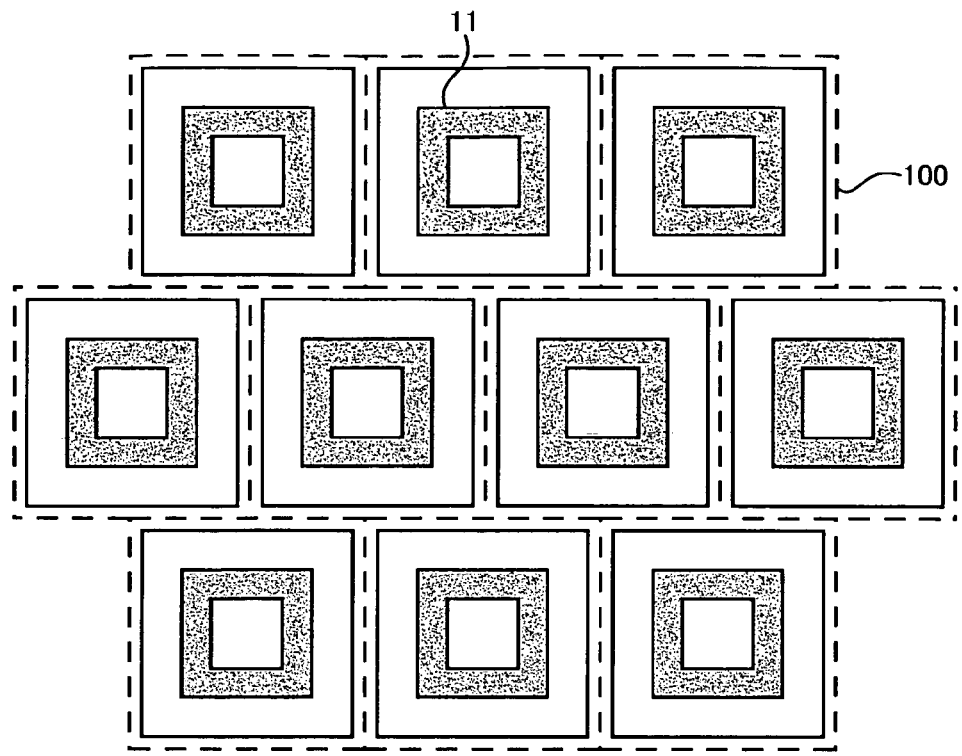
FIG. 7 is a pattern diagram of the layout where the cells of the first embodiment of the invention are arranged in a zigzag pattern

The arrangement of the cells may be the square pattern where the cells 100 are arranged lattice-like as shown in FIG. 6 or the zigzag pattern where the cells 100 are arranged zigzag-like as shown in FIG. 7. The both arrangements allow improvement in the embedding characteristics and avalanche resistance.

Though the trench contact 11 is completely continuous ring-shaped in the example of FIG. 1, it is not limited thereto, and it may be partly divided and separated into a plurality of pieces.

Second Embodiment

Figure 2A:
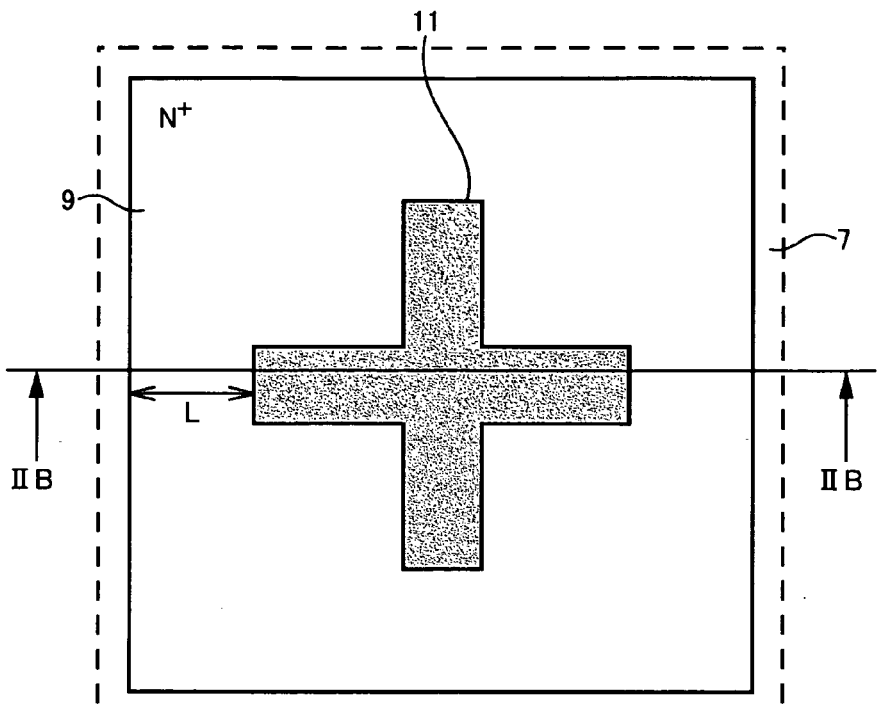
FIG. 2A is a plan view showing the structure of a MOSFET according to a second embodiment of the invention.
Figure 2B:
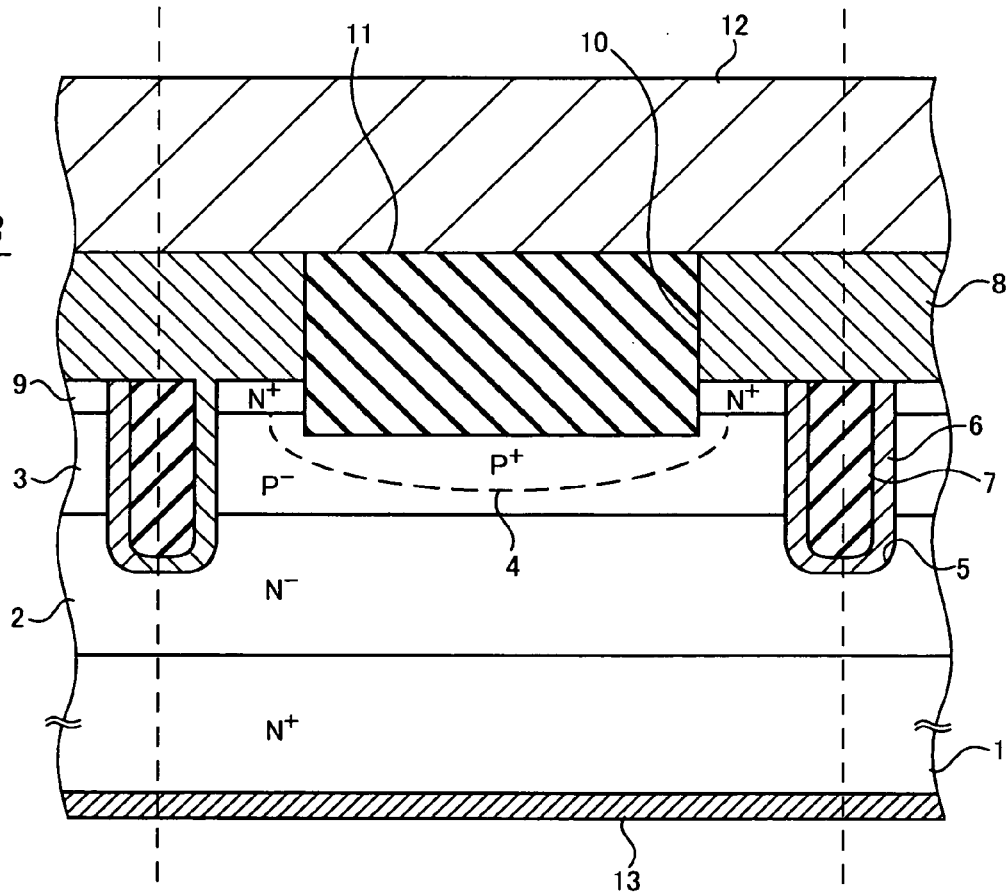
FIG. 2B is a cross sectional view of the same.

A MOSFET of a second embodiment of the invention has the trench contact 11 of a cross shape as shown in FIG. 2A. FIG. 2A is a plan view showing the structure of the MOSFET according to the second embodiment of the invention, and FIG. 2B is a cross sectional view of the same. The other structure and the manufacturing process is the same as in the first embodiment and thus not described here.

The trench contact 11 in the MOSFET of the second embodiment is cross-shaped when viewed from the top as shown in FIG. 2A. Thus, the trench contact 11 has four projecting parts that project from the center of the cell toward the middle of each side of the square gate electrode 7. The trench contact 11 is point symmetric about the center of the cell. In this embodiment, since the end of the trench contact 11 is placed within a given distance range from the gate electrode 7 in the outer periphery of the cell, the source length L is relatively short. Particularly, the positions of the ends of the trench contact 11 with respect to all the four sides of the square gate electrode 7 are within a given range and the same distance. The source length L is thereby short, and the parasitic bipolar transistor is unlikely to operate. It is thereby possible to avoid that avalanche current increases due to the operation of the parasitic bipolar transistor to cause breakdown of the MOSFET.

The cell of the MOSFET of the second embodiment is square-shaped as shown in FIG. 2A, and the cell size which is defined by its one side is 3 to 4 μm, for example. The width of the ring-shaped trench contact 11 is 0.3 to 1.2 μm and more preferably 0.4 to 0.8 μm in consideration of embedding characteristics. The source length L is 0.3 to 0.6 μm, for example.

By making the trench contact 11 cross-shaped, it is possible to reduce the width without increasing the source length L, thereby improving the embedding characteristics.

Each of the plurality of projecting parts may extend toward the corner of the gate electrode 7. If the gate electrode 7 has a polygonal shape different from a square, the same number of projecting parts as the sides may be formed to extend toward each side.

Third Embodiment

Figure 3A:
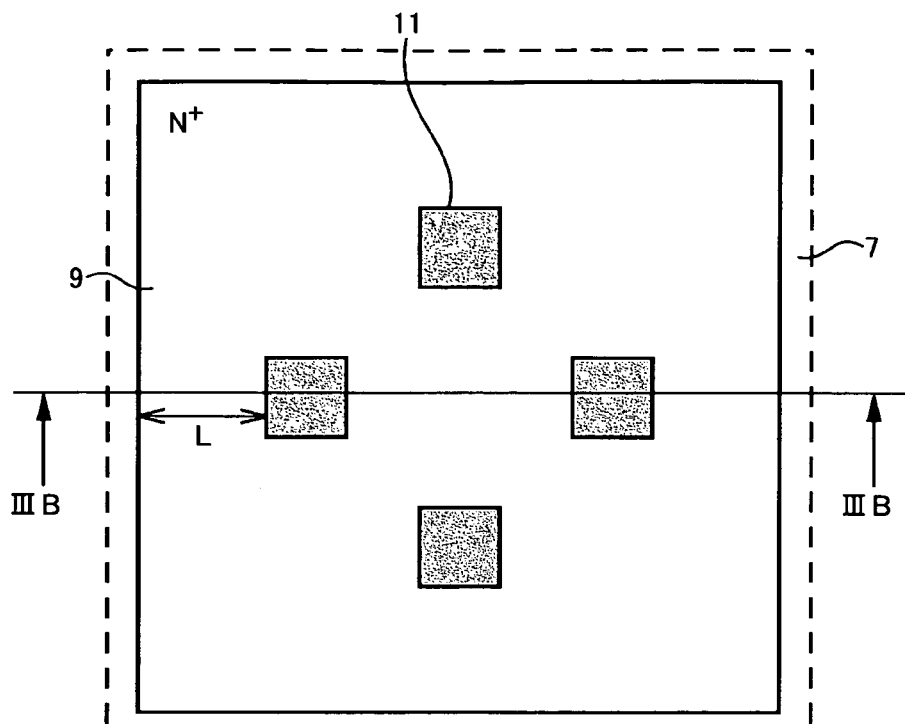
FIG. 3A is a plan view showing the structure of a MOSFET according to a third embodiment of the invention.
Figure 3B:
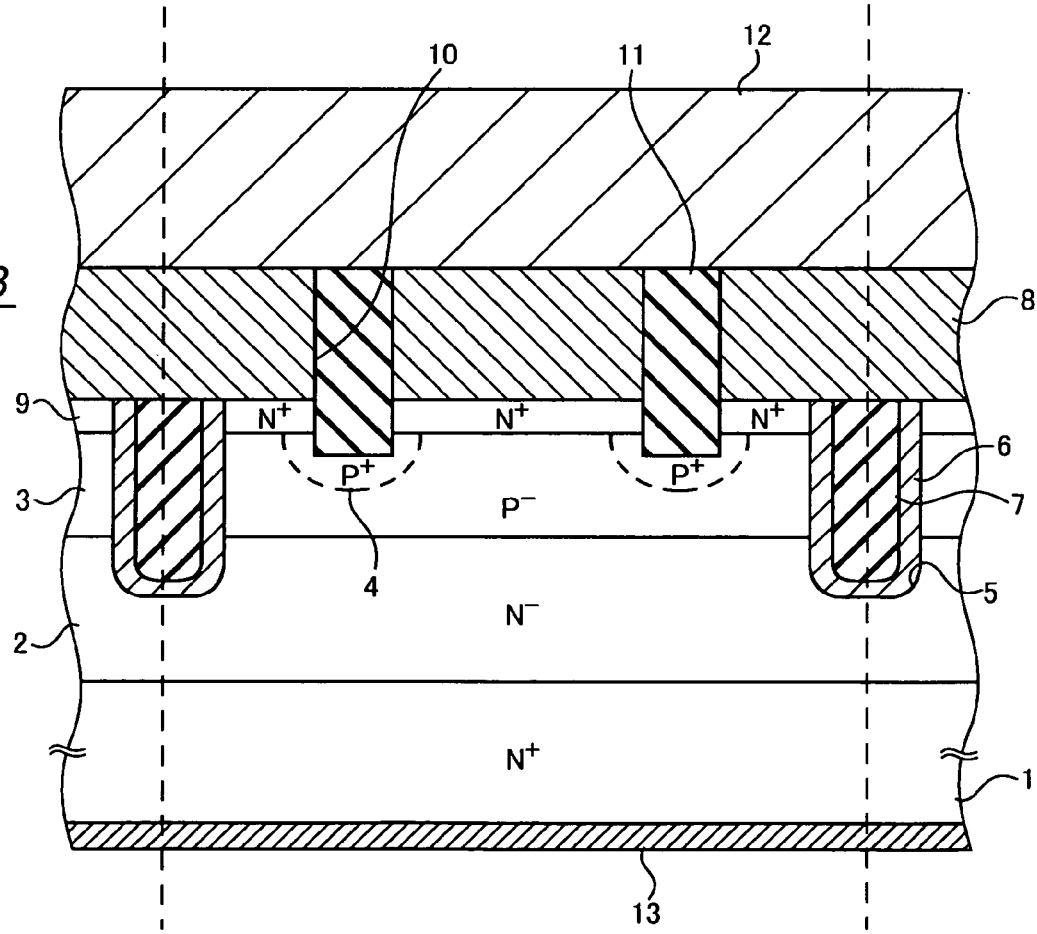
FIG. 3B is a cross sectional view of the same.

A MOSFET of a third embodiment of the invention has four pieces of the trench contact 11, each of which is placed in the vicinity of each side of the square gate electrode as shown in FIG. 3A. FIG. 3A is a plan view showing the structure of the MOSFET according to the third embodiment of the invention, and FIG. 3B is a cross sectional view of the same. The other structure and the manufacturing process is the same as in the first embodiment and thus not described here.

The contact hole 10 and the trench contact 11 in the MOSFET of the third embodiment are divided into four pieces which are separated from each other as shown in FIG. 3A. The trench contact 11 has a shape that removes the central part of the cross shape described in the second embodiment. The trench contact 11 is point symmetric about the center of the cell. The four pieces of the trench contact 11 are respectively placed in the vicinity of the middle of the four sides of the square gate electrode 7. Since the four pieces of the trench contact 11 are arranged within a given distance range from the gate electrode 7, the source length L is relatively short. Particularly, the positions of the four pieces of the trench contacts 11 with respect to all the four sides of the square gate electrode 7 are within a given range and the same distance. The source length L is thereby short, and the parasitic bipolar transistor is unlikely to operate. It is thereby possible to avoid that avalanche current increases due to the operation of the parasitic bipolar transistor to cause breakdown of the MOSFET.

The cell of the MOSFET of the third embodiment is square-shaped as shown in FIG. 3A, and the cell size which is defined by its one side is 3 to 4 μm, for example. The width of the ring-shaped trench contact 11 is 0.3 to 1.2 μm and more preferably 0.4 to 0.8 μm in consideration of embedding characteristics. The source length L is 0.3 to 0.6 μm, for example.

By dividing the trench contact 11 and placing each piece of the divided trench contact 11 in the vicinity of the gate electrode 7, it is possible to reduce the width without increasing the source length L, thereby improving the embedding characteristics.

Fourth Embodiment

Figure 4A:
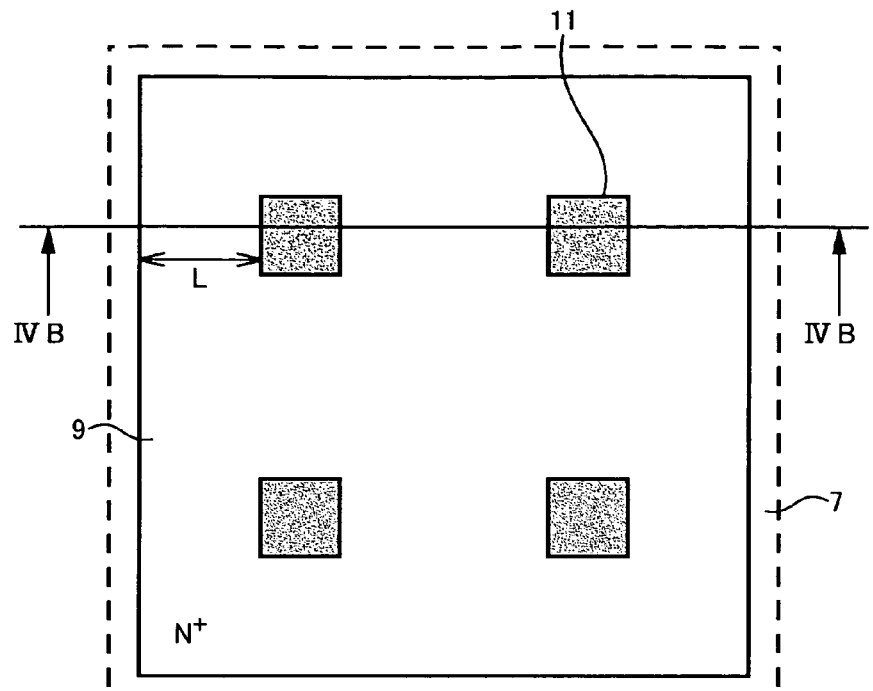
FIG. 4A is a plan view showing the structure of a MOSFET according to a fourth embodiment of the invention.
Figure 4B:
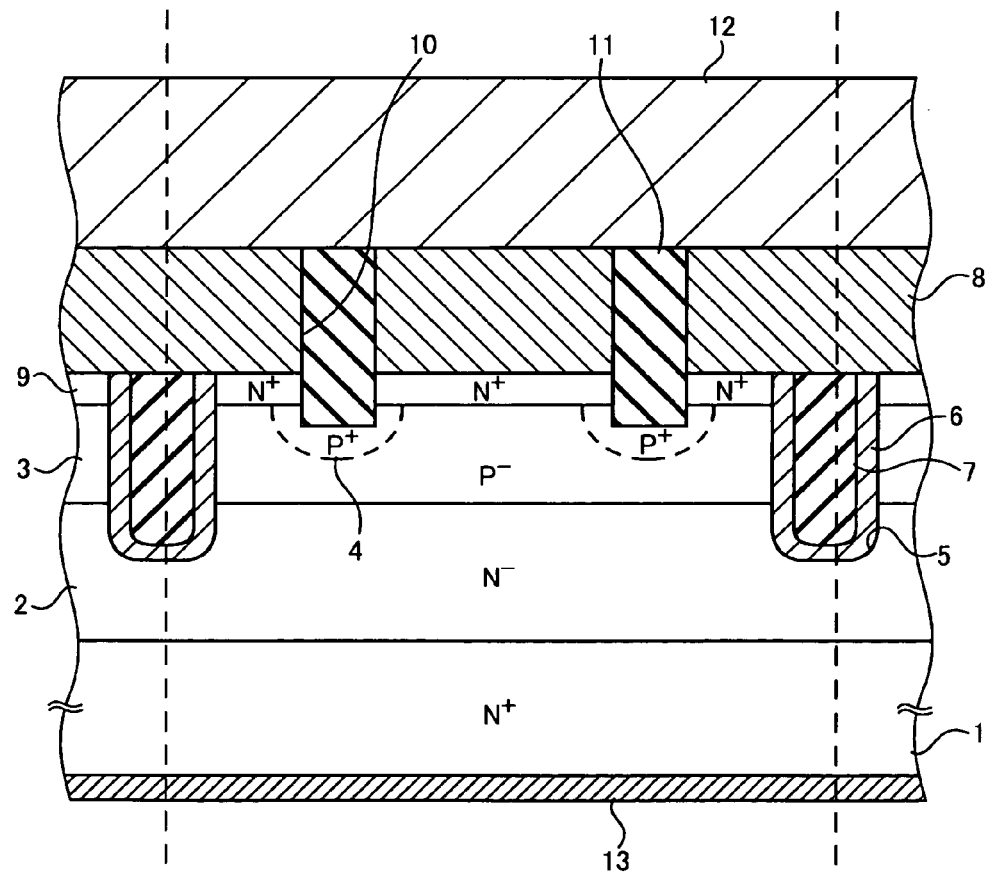
FIG. 4B is a cross sectional view of the same.

A MOSFET of a fourth embodiment of the invention has four pieces of the trench contact 11, each of which is placed in the vicinity of each corner of the square gate electrode as shown in FIG. 4A. FIG. 4A is a plan view showing the structure of the MOSFET according to the fourth embodiment of the invention, and FIG. 4B is a cross sectional view of the same. The other structure and the manufacturing process is the same as in the first embodiment and thus not described here.

The contact hole 10 and the trench contact 11 in the MOSFET of the fourth embodiment are divided into four pieces which are separated from each other as shown in FIG. 4A. The trench contact 11 has a shape that removes the part other than the corners of the square shape shown in FIG. 1. The trench contact 11 is point symmetric about the center of the cell. The four pieces of the trench contacts 11 are respectively placed in the vicinity of the corners of the square gate electrode 7. Since the four pieces of the trench contact 11 are arranged within a given distance range from the gate electrode 7, the source length L is relatively small. Particularly, the positions of the four pieces of the trench contacts 11 with respect to all the four sides and corners of the square gate electrode 7 are within a given range and the same distance. The source length L is thereby short, and the parasitic bipolar transistor is unlikely to operate. It is thereby possible to avoid that avalanche current increases due to the operation of the parasitic bipolar transistor to cause breakdown of the MOSFET.

The cell of the MOSFET of the fourth embodiment is square-shaped as shown in FIG. 1, and the cell size which is defined by its one side is 3 to 4 μm, for example. The width of the ring-shaped trench contact 11 is 0.3 to 1.2 μm and more preferably 0.4 to 0.8 μm in consideration of embedding characteristics. The source length L is 0.3 to 0.6 μm, for example.

By dividing the trench contact 11 and placing each piece of the divided trench contact 11 in the vicinity of the gate electrode 7, it is possible to reduce the width without increasing the source length L, thereby improving the embedding characteristics.

Fifth Embodiment

A MOSFET of a fifth embodiment of the invention has the same structure as of the first embodiment except that the $N^+$ source layer is divided.

Figure 5:
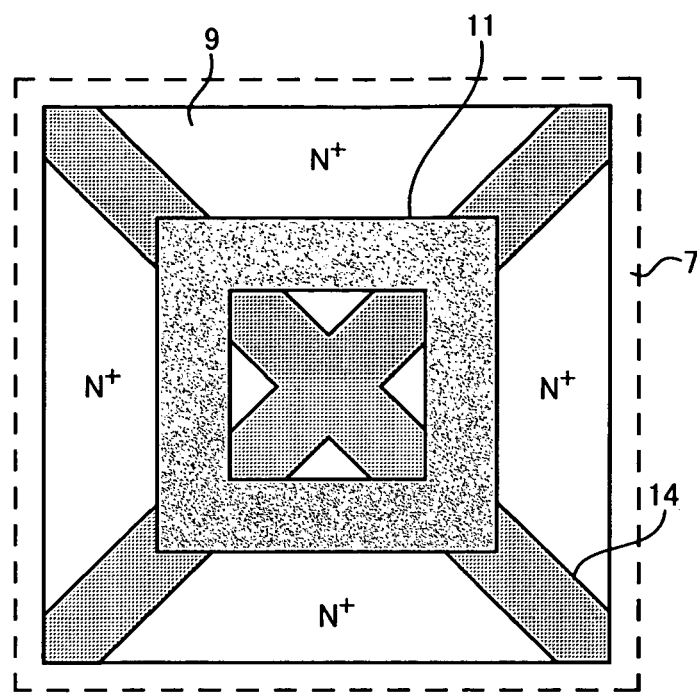
FIG. 5 is a plan view showing the structure of a MOSFET according to a fifth embodiment of the invention.

In the MOSFET of this embodiment, the $N^+$ source layer 9 is diagonally divided into four parts by the area 14 where the $N^+$ source layer 9 is not formed as shown in FIG. 5. Thus, each part of the $N^+$ source layer 9 is substantially fan-shaped. The parasitic bipolar transistor between the source region and the base region is thereby unlikely to be conducted in the OFF-state of a gate voltage, allowing the avalanche resistance to increase.

Further, the trench contact 11 in the MOSFET of this embodiment is ring or circular shaped and in contact with the fan-shaped $N^+$ source layer 9 so as to intersect therewith. It is thereby possible to suppress an increase in contact resistance.

Though the trench contact of the MOSFET of this embodiment is ring-shaped as described in the first embodiment, it may be cross-shaped as described in the second embodiment or may be divided in to several pieces as described in the third embodiment. These cases also allow reliable contact between the trench contact and each part of the $N^+$ source layer 9, thereby suppressing an increase in contact resistance.

Further, the $N^+$ source layer 9 may have a notch with substantially the same width diagonally from the corner to the center as described in Japanese Patent No. 3099917. In this case, no notch exists in the central part of the plane shape of the $N^+$ source layer 9, and a part of the $P^-$ base layer 3 is exposed only in the notch part.

Other Embodiments

Figure 8:
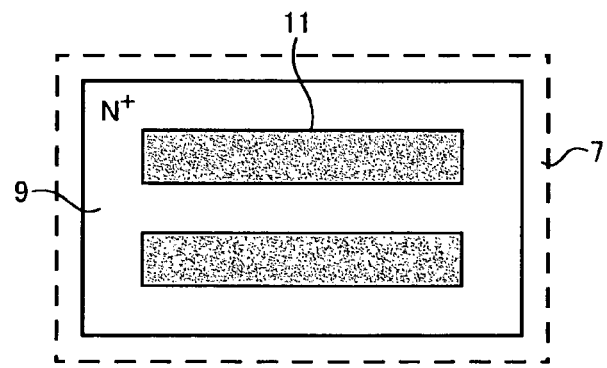
FIG. 8 is a view showing the structure of a MOSFET according to another embodiment of the invention in a rectangular cell shape.
Figure 9:
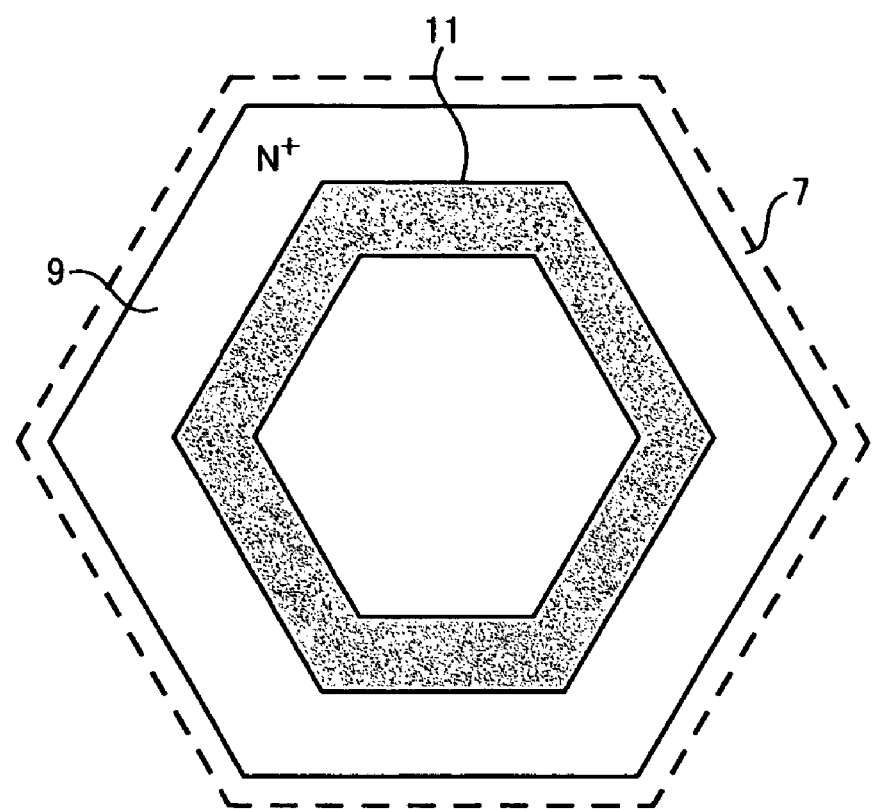
FIG. 9 is a view showing the structure of a MOSFET according to another embodiment of the invention in a hexagonal cell shape.
Figure 10A:
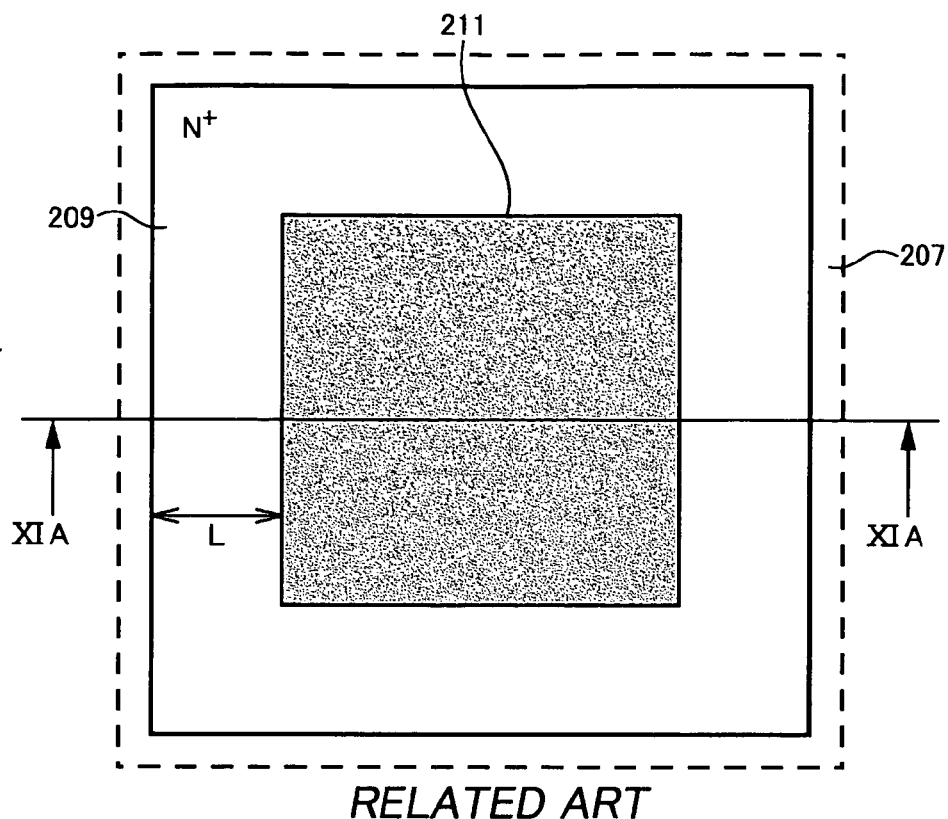
FIGS. 10A and 10B are views showing the structures of conventional MOSFETs.
Figure 10B:
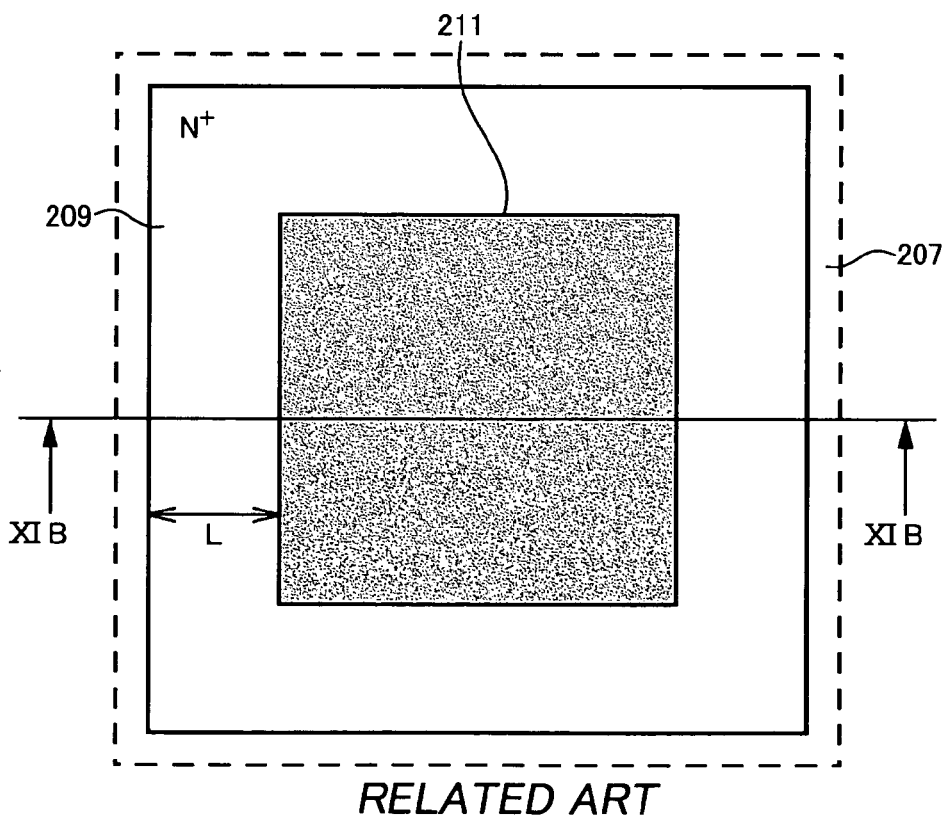
Figure 11A:
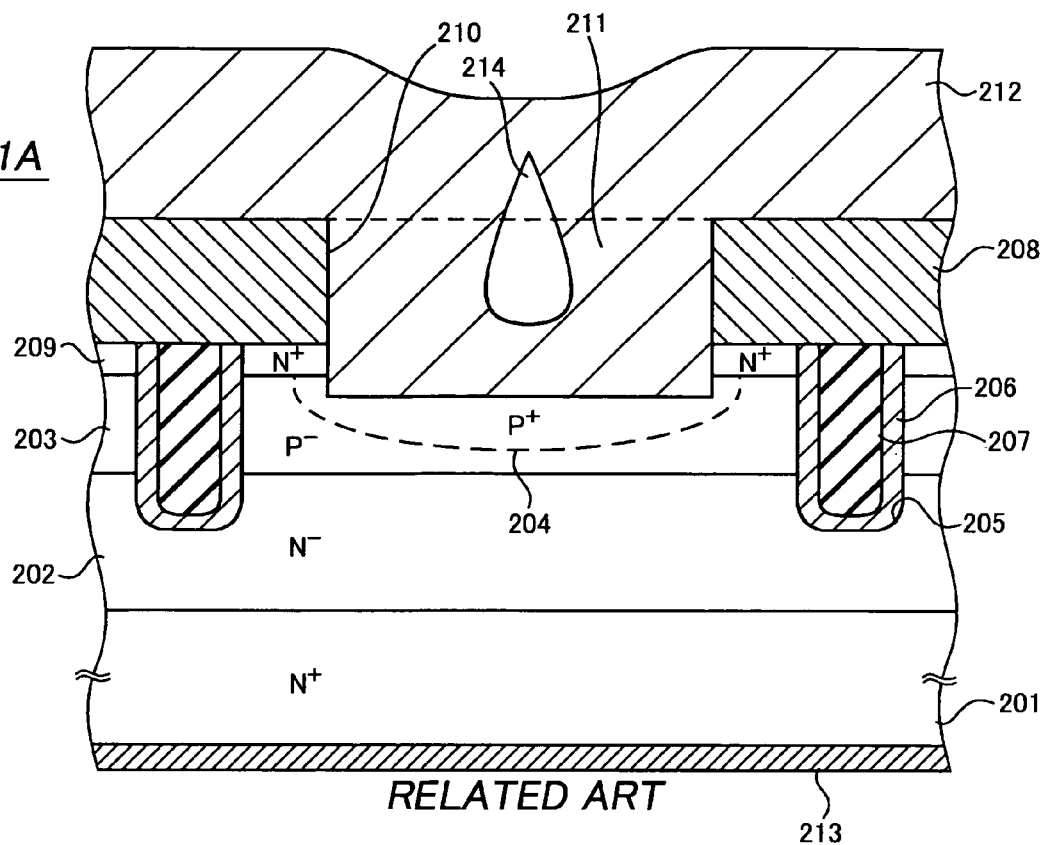
FIG. 11A is a cross sectional view along line XIA-XIA of FIG. 10A showing the structure of a conventional MOSFET.
Figure 11B:
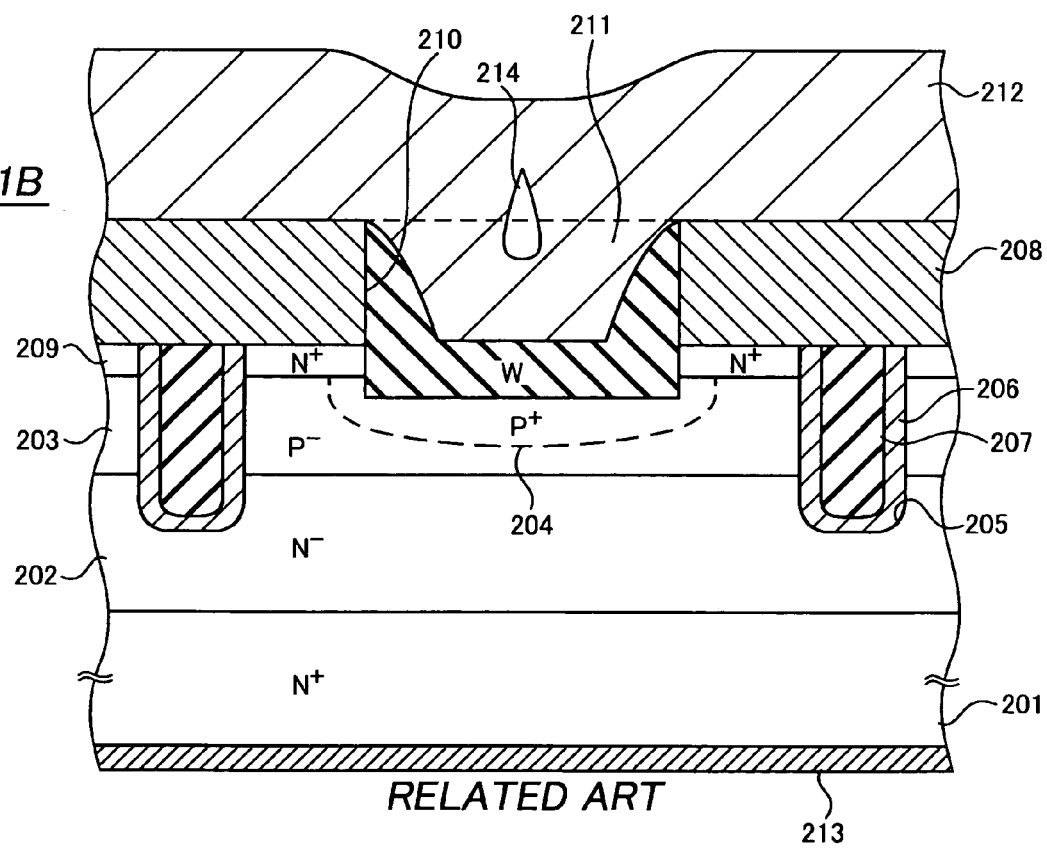
FIG. 11B is a cross sectional view along line XIB-XIB of FIG. 10B showing the structure of a conventional MOSFET.
Figure 12A:
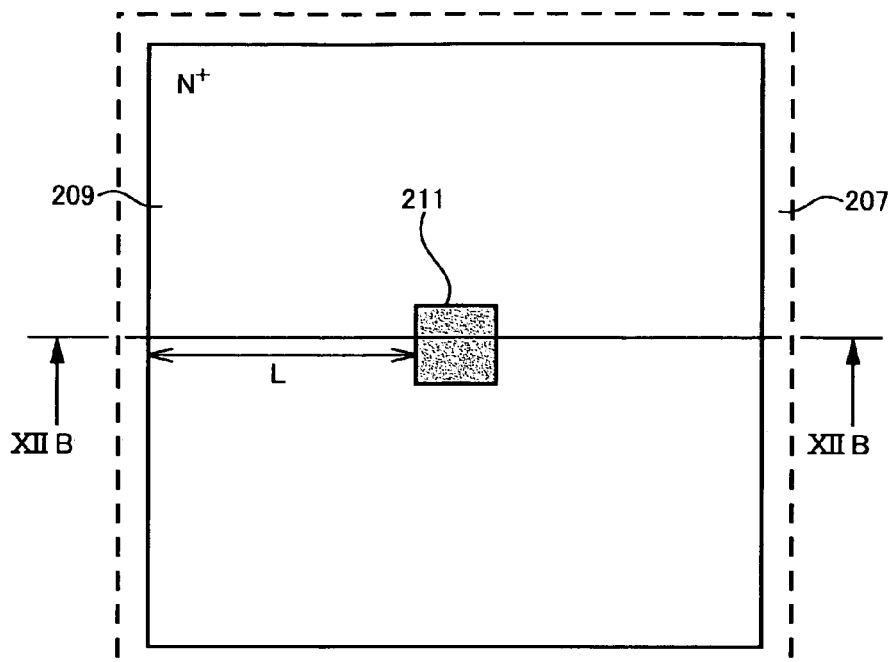
FIG. 12A is a plan view showing the structure of a conventional MOSFET in which the aperture diameter of a trench contact is reduced.
Figure 12B:
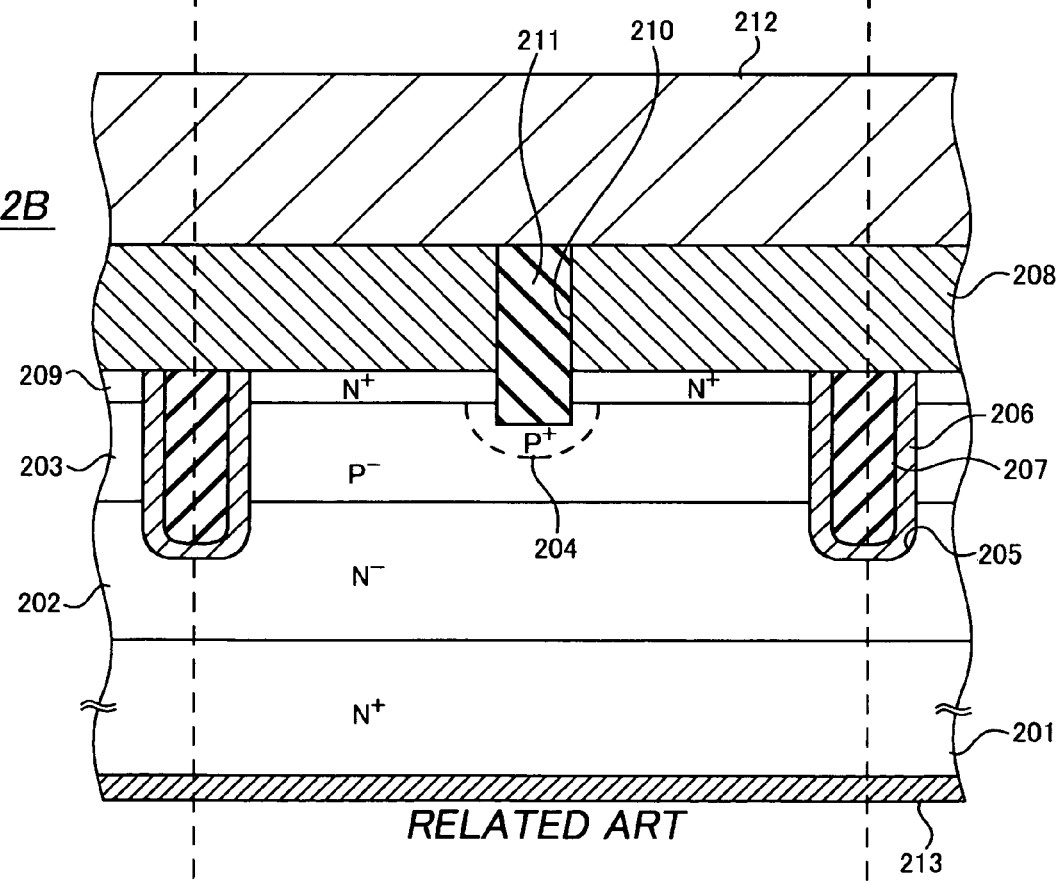
FIG. 12B is a cross sectional view of the same.
Figure 13:
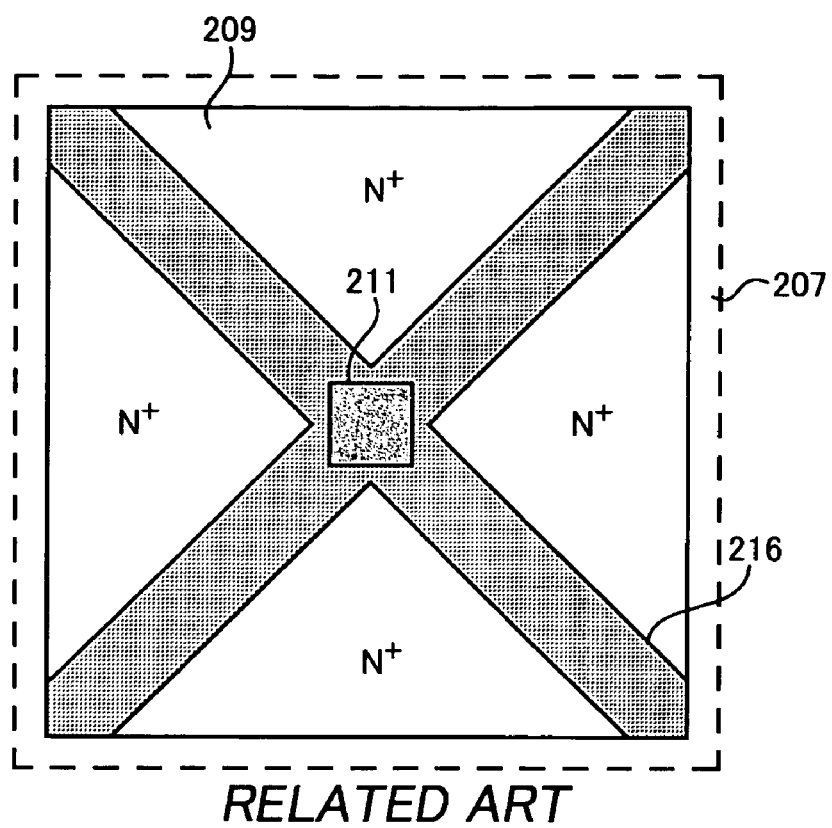
FIG. 13 is a top view showing the structure of a conventional MOSFET in which the aperture diameter of a trench contact is reduced and which has a noncyclic source layout.

Although the shape of the cell, which is the shape of the gate electrode, is square in the above embodiments, it is not limited thereto, and it may be rectangular, polygonal such as triangle and hexagonal, or circular. If the cell or the gate electrode is rectangular, two linear pieces of the trench contact 11 which are parallel to the longer sides may be formed as shown in FIG. 8. Both ends of the two linear pieces of the trench contact 11 are located in the vicinity of the gate electrode 7. Further, if it is hexagonal, the hexagonal trench contact 11 whose sides are parallel to those of the hexagonal gate electrode 7 may be formed as shown in FIG. 9. The gate electrode 7 and the trench contact 11 shown in FIG. 9 are both regular hexagons.

It is apparent that the present invention is not limited to the above embodiment and it may be modified and changed without departing from the scope and spirit of the invention.

What is claimed is:

1. A field effect transistor comprising:
a base layer and a source layer formed in a cell surrounded by a trench gate in a semiconductor substrate, said base and source layers comprising a linear ring shape trench;
a trench contact formed in the linear ring-shaped trench of said source and base layers and extending from a first surface of the semiconductor substrate;
a source electrode formed above the first surface and connected to the trench contact; and
a drain electrode formed on a second surface opposite from the first surface,
wherein the trench contact comprises a linear ring shape when viewed from the first surface and is surrounded by the trench gate, and
wherein the trench contact has a width in a range from of 0.3 μm to 1.2 μm.

2. The field effect transistor of claim 1, wherein the source layer comprises a first portion which is formed between the trench gate and the trench contact, and a second portion which is separate from the first portion and surrounded by the trench contact.

3. The field effect transistor of claim 1, wherein the gate has a polygonal shape, and the source layer is divided or notched by a dividing part or a notch pan formed diagonally in the polygonal shape.

4. The field effect transistor of claim 1, wherein the trench contact comprises tungsten.

5. The field effect transistor of claim 1, wherein the gate comprises a hexagonal lattice shape when viewed from the first surface, and the trench contact comprises a hexagonal ring shape when viewed from the first surface.

6. The field effect transistor of claim 3, wherein the source layer comprises a plurality of parts and the trench contact contacts each of said plurality of parts.

7. The field effect transistor of claim 6, wherein the plurality of parts comprises a plurality of fan-shaped parts.

8. The field effect transistor of claim 1, wherein a bottom portion of the trench contact is formed deeper than a bottom portion of the source layer and formed in the base layer.

9. The field effect transistor of claim 1, wherein said cell comprises a side having a length in a range from 3 μm to 4 μm.

10. The field effect transistor of claim 1, wherein the trench contact has a width of 0.4 μm to 0.8 μm.

11. The field effect transistor of claim 1, wherein a source length, L, which comprises a distance between said trench gate and said trench contact, is 0.3 μm to 0.6 μm.

12. The field effect transistor of claim 1, wherein the trench contact is placed substantially the same distance from each side of the gate.

13. The field effect transistor of claim 1, further comprising:

an interlayer oxide film formed on said source layer and comprising an inner portion which is formed inside said linear ring shape of said trench contact, and an outer portion which is formed outside said linear ring shape of said trench contact.

14. The field effect transistor of claim 1, wherein said trench contact is symmetric about a central area of the cell.

15. A field effect transistor cell comprising:
a semiconductor substrate comprising:
   a base layer having a first conductivity type; and
   a source layer formed on said base layer and having a second conductivity type different than said first conductivity type;
a trench gate formed in said semiconductor substrate around an outer periphery of said cell, and around said source and base layers;
an interlayer oxide film formed on said source layer and on said trench gate; and
a linear ring-shaped trench contact formed in said interlayer oxide film and said source and base layers, the trench contact being symmetric about a central area of said cell and having a width in a range from of 0.3 μm to 1.2 μm.

16. A field effect transistor cell comprising:
a drain electrode;
a semiconductor substrate formed on said drain electrode, comprising:
   a base layer having a first conductivity type; and
   a source layer formed on said base layer and having a second conductivity type different than said first conductivity type;
a trench gate formed in said semiconductor substrate around an outer periphery of said cell, and around said source and base layers;
an interlayer oxide film formed on said source layer and on said trench gate;
a linear ring-shaped trench contact formed in said interlayer oxide film and said source and base layers, the trench contact being symmetric about a central area of said cell and having a width in a range from of 0.3 μm to 1.2 μm; and
a source electrode formed on said interlayer oxide film and connected to the trench contact,
wherein the source layer comprises a first portion which is formed between the trench gate and the trench contact, and a second portion which is formed in the central area of the cell and is separate from the first portion and surrounded by the trench contact, and
wherein a source length, L, which comprises a distance between said trench gate and said trench contact, is in a range from 0.3 μm to 0.6 μm.

17. The field effect transistor of claim 15, wherein the trench contact comprises tungsten.

18. The field effect transistor of claim 16, wherein the trench contact comprises tungsten.

19. The field effect transistor of claim 1, wherein said base layer comprises a linear ring-shaped base contact layer formed under the linear ring-shaped trench in said base layer.

* * * * *